(12) United States Patent
Zhang et al.

(10) Patent No.: US 12,550,568 B2
(45) Date of Patent: Feb. 10, 2026

(54) LIGHT-EMITTING BASE PLATE FOR IMPROVING DISPLAY UNIFORMITY AND METHOD FOR MANUFACTURING THE SAME, AND LIGHT-EMITTING DEVICE

(71) Applicant: BOE TECHNOLOGY GROUP CO., LTD., Beijing (CN)

(72) Inventors: Xing Zhang, Beijing (CN); Pan Xu, Beijing (CN); Ying Han, Beijing (CN); Chengyuan Luo, Beijing (CN); Donghui Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 18/025,263

(22) PCT Filed: May 31, 2022

(86) PCT No.: PCT/CN2022/096384
§ 371 (c)(1),
(2) Date: Mar. 8, 2023

(87) PCT Pub. No.: WO2023/230888
PCT Pub. Date: Dec. 7, 2023

(65) Prior Publication Data
US 2024/0292695 A1    Aug. 29, 2024

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/122* (2023.02); *H10K 59/124* (2023.02); *H10K 2102/3026* (2023.02)

(58) Field of Classification Search
CPC ........... H10K 59/1315; H10K 59/1201; H10K 59/122
(Continued)

(56) References Cited

U.S. PATENT DOCUMENTS

2019/0229164 A1* 7/2019 Kim ..................... H10K 59/131
2020/0212156 A1   7/2020 Gu et al.
(Continued)

FOREIGN PATENT DOCUMENTS

CN   103700675 A   4/2014
CN   107342370 A   11/2017
(Continued)

*Primary Examiner* — Xia L Cross
(74) *Attorney, Agent, or Firm* — WHDA, LLP

(57) ABSTRACT

Light-emitting base plate and method for preparing the same and a light-emitting device is provided, relating to the field of display technology. The light-emitting base plate includes a substrate, a functional layer disposed at one side of the substrate, and a first insulating layer and a first electrode layer stacked at one side of the functional layer away from the substrate, the first insulating layer is located between the functional layer and the first electrode layer; wherein the functional layer includes: a first electrode wiring located at the display area, an electrode signal bus located at the frame area, and an electrode signal leading wire connecting the first electrode wiring and the electrode signal bus; the first electrode layer is connected to the first electrode wiring by a first via hole provided at the first insulating layer.

20 Claims, 5 Drawing Sheets

(51) Int. Cl.
   *H10K 59/122*   (2023.01)
   *H10K 59/124*   (2023.01)
   *H10K 102/00*   (2023.01)

(58) Field of Classification Search
   USPC .......................................................... 257/40
   See application file for complete search history.

(56)              References Cited

U.S. PATENT DOCUMENTS

2022/0149142  A1    5/2022   Huang et al.
   2022/0199652  A1    6/2022   Shang et al.
   2022/0262890  A1    8/2022   Cheng et al.
   2023/0180561  A1    6/2023   Yang et al.

FOREIGN PATENT DOCUMENTS

CN          109713012  A      5/2019
   CN          110751922  A      2/2020
   CN          111584610  A      8/2020
   CN          113284921  A      8/2021
   CN          114335114  A      4/2022
   WO         2021/248489 A1    12/2021

* cited by examiner

LIGHT-EMITTING BASE PLATE FOR IMPROVING DISPLAY UNIFORMITY AND METHOD FOR MANUFACTURING THE SAME, AND LIGHT-EMITTING DEVICE

FIELD

The present disclosure relates to the field of optoelectronic area and, more particularly, to a light-emitting base plate and a method for manufacturing the same, and a light-emitting device.

BACKGROUND

Organic Light Emitting Diode (OLED) is an active light-emitting device, which has the advantages of self-illumination, high contrast, low power consumption, wide color gamut, thinness and deformability.

SUMMARY

The present disclosure discloses a light-emitting base plate, including a display area and a frame area located at one side of the display area, wherein the light-emitting base plate comprises: substrate, a functional layer disposed at one side of the substrate, and a first insulating layer and a first electrode layer stacked at one side of the functional layer away from the substrate, the first insulating layer is located between the functional layer and the first electrode layer;
wherein the functional layer comprises: a first electrode wiring located at the display area, an electrode signal bus located at the frame area, and an electrode signal leading wire connecting the first electrode wiring and the electrode signal bus; the first electrode layer is connected to the first electrode wiring by a first via hole provided at the first insulating layer.

In an alternative embodiment, wherein the functional layer further includes: wherein the functional layer further comprises: a data signal leading wire located at the frame area and a data wiring located at the display area, the data signal leading wire is connected to the data wiring;
wherein an orthographic projection of the data signal leading wire and an orthographic projection of the electrode signal leading wire on the substrate overlap, the data signal leading wire and the electrode signal leading wire are located at different layers.

In an alternative embodiment, wherein the functional layer comprises a first wiring layer, a second insulating layer, a second wiring layer, a third insulating layer and a third wiring layer disposed in stack, the first insulating layer is provided at a side of the third wiring layer away from the substrate;
wherein the data signal leading wire is located at the second wiring layer, and the electrode signal leading wire is located at the third wiring layer.

In an alternative embodiment, the electrode signal bus is located at the first wiring layer, the third wiring layer further comprises: a first adapting portion connected to one end of the electrode signal leading wire which is close to the electrode signal bus, the first adapting portion and the electrode signal bus are connected via a second via hole provided on the second insulating layer and the third insulating layer.

In an alternative embodiment, the second via hole includes a third via hole disposed the third insulating layer, and a fourth via hole disposed at the second insulating layer; the second wiring layer further comprises a second adapting portion located at the frame area, the second adapting portion is connected to the first adapting portion via the third via hole, and the second adapting portion is connected to the electrode signal bus via the fourth via hole.

In an alternative embodiment, the third wiring layer further comprises: a third adapting portion connected to one end of electrode signal leading wire close to the first electrode wiring;
one end of the first electrode wiring close to the electrode signal bus extends to the frame area, and is connected to the fourth adapting portion, the first electrode wiring and the fourth adapting portion are both located at the second wiring layer;
wherein the third adapting portion and the fourth adapting portion are connected via a fifth via hole disposed at the third insulating layer.

In an alternative embodiment, the functional layer includes a first TFT located at the display area, the data wiring, and a source and a drain of the first TFT are all located at the second wiring layer, the data wiring is connected to the source or the drain of the first TFT;
wherein an extending direction of the data wiring is the same as an extending direction of the first electrode wiring.

In an alternative embodiment, the functional layer includes a second TFT located at the display area, the first wiring layer further comprises a gate wiring located at the display area, and a gate of the second TFT, the gate wiring is connected to the gate of the second TFT.

In an alternative embodiment, the functional layer includes a third TFT located at the display area, the third wiring layer further comprises a plurality of second electrodes located in the display area, the second electrode is connected to the third TFT.

In an alternative embodiment, the first insulating layer is reused as a pixel defining layer, the pixel defining layer has a plurality of pixel openings, the orthographic projection of the pixel openings on the substrate are located within the scope of the orthographic projection of the second electrode on the substrate;
the light-emitting base plate further includes a luminescent layer disposed in the pixel opening, and the first electrode layer is disposed at a side of the luminescent layer away from the substrate.

In an alternative embodiment, the data signal leading wire is located at the same side of the display area as the electrode signal bus.

In an alternative embodiment, an extending direction of the first electrode wiring is different from an extending direction of the electrode signal bus; or, an extending direction of the first electrode wiring is perpendicular to an extending direction of the electrode signal bus.

In an alternative embodiment, the functional layer further comprises: a data signal leading wire located at the frame area, and a data wiring located at the display area, the data signal leading wire being connected to the data wiring;
wherein an orthographic projection of the data signal leading wire on the substrate and an orthographic projection of the electrode signal leading wire on the substrate do not overlap, the data signal leading wire and the electrode signal leading wire are disposed at the same layer.

In an alternative embodiment, the data signal leading wire and the electrode signal bus are located at different sides of the display area.

In an alternative embodiment, the first electrode layer is connected to the electrode signal bus via a sixth via hole disposed at the first insulating layer.

The present disclosure discloses a light-emitting device, including any one of the light-emitting base plate above.

The present disclosure discloses a method for manufacturing a light-emitting base plate, the light-emitting base plate comprises a display area and a frame area located at one side of the display area, The preparation method comprises:

providing a substrate;

forming a functional layer at one side of the substrate, and the functional layer comprises: a first electrode wiring located at the display area, located at the display The electrode signal bus of the frame area, and the connection between the first electrode wiring and the electrode signal bus electrode signal leading wire;

forming a first insulating layer and a first electrode layer in turn at one side of the functional layer away from the substrate, wherein the first insulating layer is located between the functional layer and the first electrode layer, and the first electrode layer is connected to the first electrode wiring through a first via hole disposed at the first insulating layer.

The above description is only an overview of the present disclosure of the technical solution, in order to be able to better understand the technical means of the present disclosure, and may be implemented in accordance with the content of the description, and in order to make the above and other purposes, features and advantages of the present disclosure more obvious and easier to understand, the specific embodiments of the present disclosure are hereby mentioned.

BRIEF DESCRIPTION OF THE DRAWINGS

In order to more clearly illustrate the technical solutions in the embodiments of the present disclosure, in the following, a brief introduction to the drawings required in the embodiments or related technical description are shown, it is clear that the drawings described below are some embodiments of the present disclosure, for those persons skilled in the art, they may also obtain other drawings based on these drawings without creativity. It should be noted that the proportions in the drawings are for illustrative purposes only and do not represent the actual proportions.

DETAILED DESCRIPTION

In order to make the purpose, technical solution and advantages of the embodiments of the present disclosure clearer, in the following, the accompanying drawings will be combined to clearly and completely describe the technical solutions of the embodiments of the present disclosure. Obviously, the described embodiments are part of the embodiments of the present disclosure, they are not all embodiments. Based on the embodiments disclosed the present disclosure, all other embodiments obtained by a skilled person in the art without creativity fall within the scope of the protection of the present disclosure.

In large-sized top-emitting OLED devices, the cathode is usually made of materials with higher transmittance, for example, the material may be metal oxide such as indium zinc oxide. Due to the large impedance of the metal oxide, there is a serious IR drop in the cathode, which affects the display uniformity. In order to solve this problem, a metal auxiliary cathode is generally disposed, and the auxiliary cathode and the cathode are connected through via holes.

Figure 1:
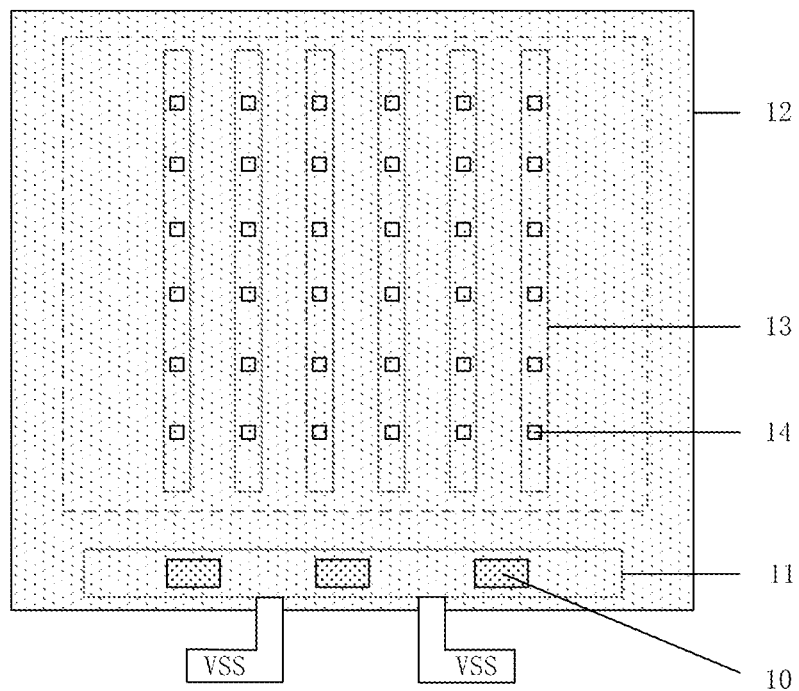
FIG. 1 is a schematic diagram showing the planar structure of the light-emitting base plate in the related art.

FIG. 1 is a schematic diagram showing the planar structure of a light-emitting base plate in a related art. With reference to FIG. 1, as shown in FIG. 1, a cathode signal input bus 11 is connected to a signal input terminal VSS, and the cathode signal input bus 11 and a cathode 12 are connected by passing through a via hole 10, the cathode 12 and the auxiliary cathode 13 are connected through a via hole 14. Thus, the transmission path of the voltage signal VSS on the auxiliary cathode 13 is: the signal input terminal VSS to the cathode signal input bus 11, to the via hole 10, to the cathode 12, to the via hole 14, to the auxiliary cathode 13. It may be seen that the signal on the auxiliary cathode 13 comes from the cathode 12, and the cathode 12 itself has a serious IR drop, so that the signal transmission path shown in FIG. 1 affects the effect of using the auxiliary cathode 13 to reduce the IR drop.

Figure 2:
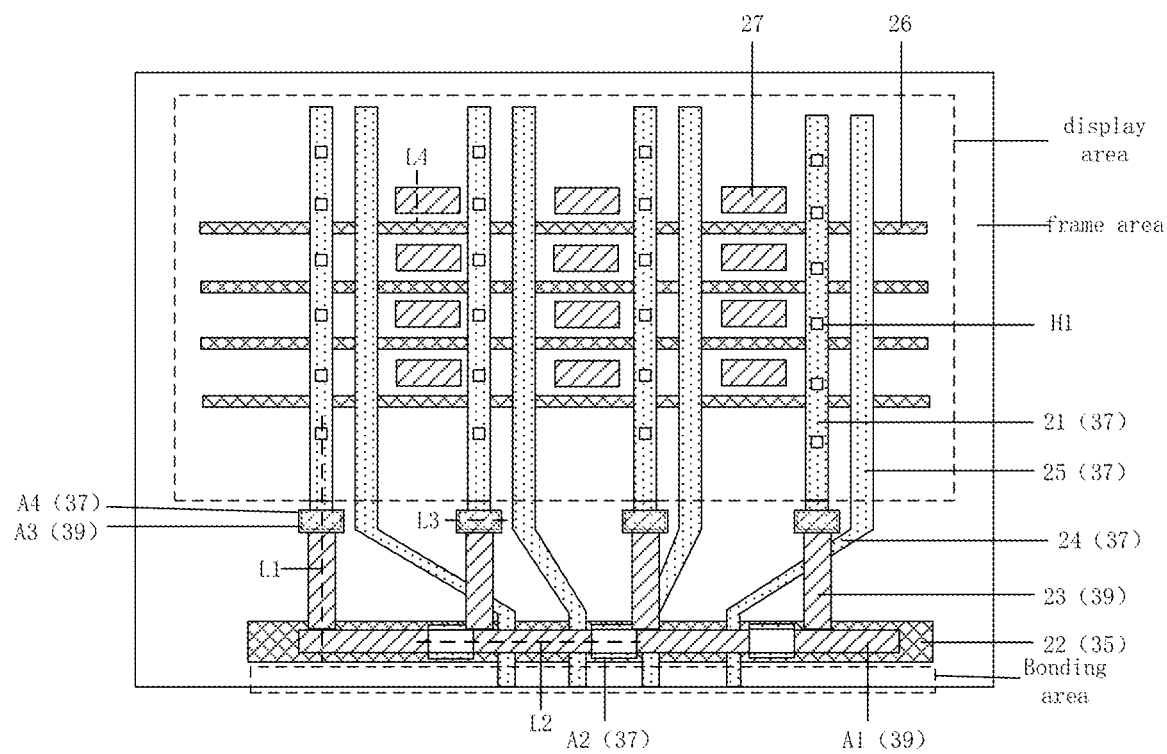
FIG. 2 is a schematic diagram showing the planar structure of a first type of the light-emitting base plate according to an embodiment of the present disclosure.
Figure 7:
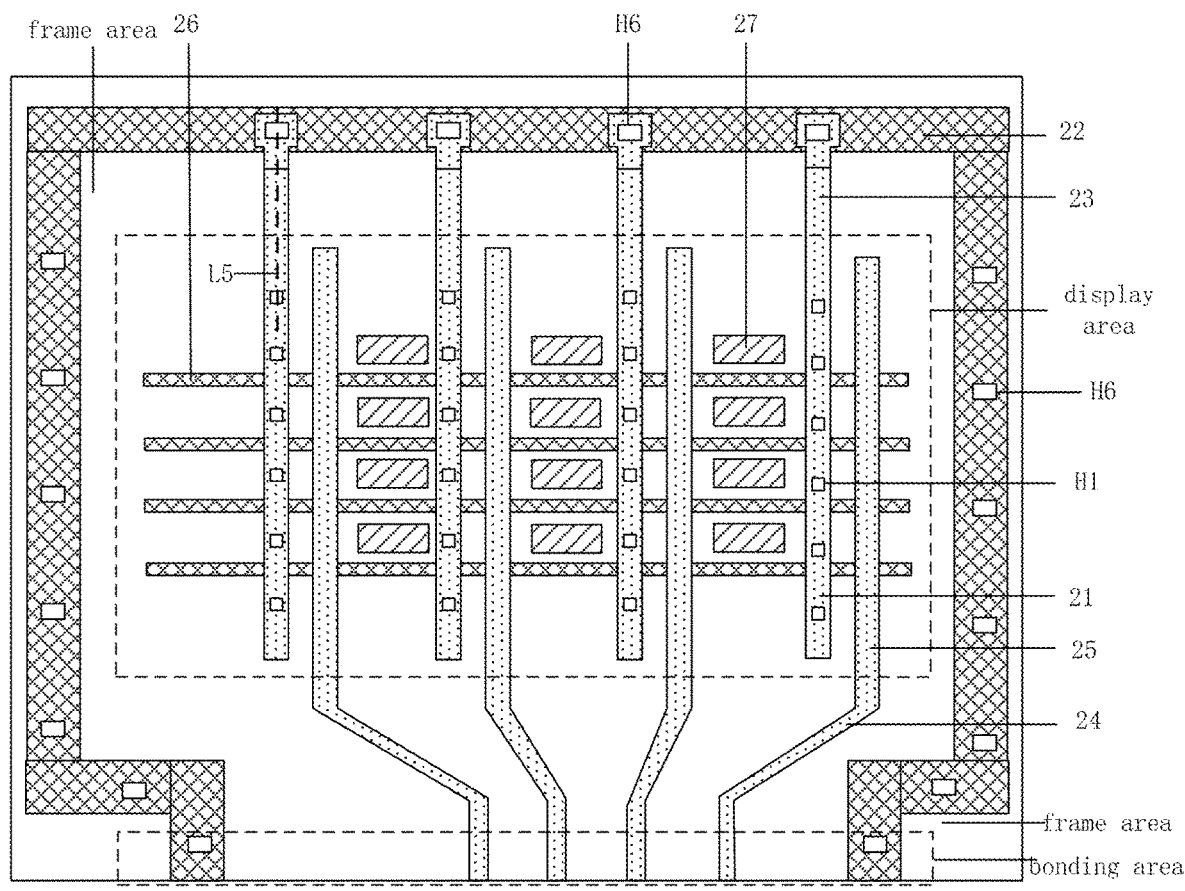
FIG. 7 is a schematic diagram showing the planar structure of a second type of the light-emitting base plate according to an embodiment of the present disclosure.

In order to enhance the effect for the auxiliary electrode to reduce the IR drop, the present disclosure provides a light-emitting base plate. Referring to FIG. 2 and FIG. 7, they are schematic diagrams showing the planar structure of the light-emitting base plate provided in the present disclosure, respectively. As shown in FIG. 2 or FIG. 7, the light-emitting base plate includes a display area and a frame area located at a side of the display area.

Figure 3:
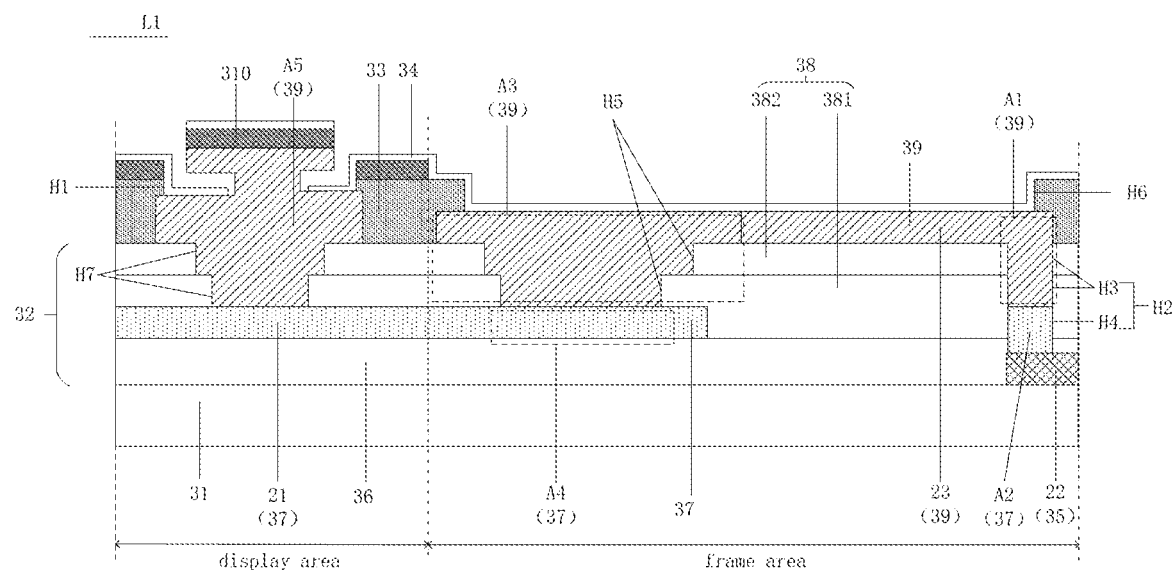
FIG. 3 is a sectional diagram showing the section of the first type of the light-emitting base plate at L1 position according to an embodiment of the present disclosure.
Figure 8:
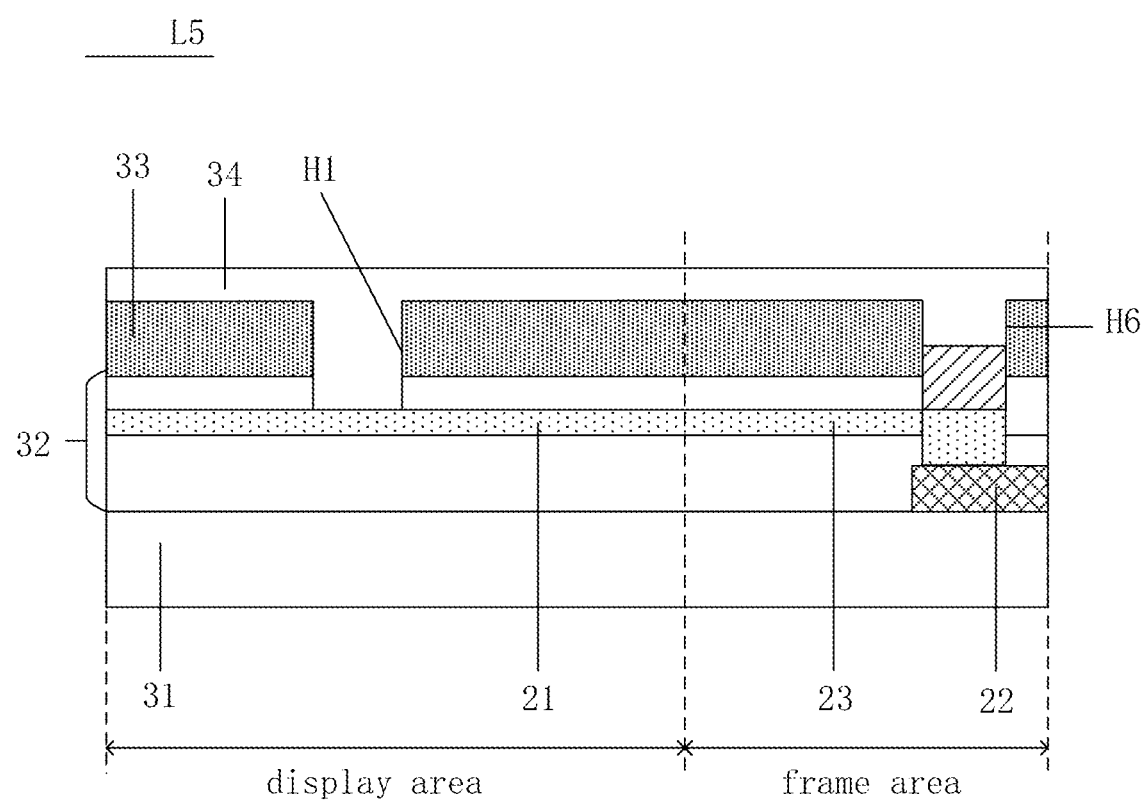
FIG. 8 is a sectional diagram showing the section of the second type of the light-emitting base plate at L5 position according to an embodiment of the present disclosure.

FIG. 3 is a sectional diagram showing the section of the first type of the light-emitting base plate at L1 position according to an embodiment of the present disclosure. FIG. 8 is a sectional diagram showing the section of the second type of the light-emitting base plate at L5 position according to an embodiment of the present disclosure. As shown in FIG. 3 or FIG. 8, the light-emitting base plate includes: a substrate 31, a functional layer 32 disposed at one side of the substrate 31, and a first insulating layer 33 and a first electrode layer 34 stacked at one side of the functional layer 32 away from the substrate 31, the first insulating layer 33 is located between the functional layer 32 and the first electrode layer 34.

The functional layer 32 includes: a first electrode wiring 21 located at the display area, an electrode signal bus 22 located at the frame area, and an electrode signal leading wire 23 connecting the first electrode wiring 21 and the electrode signal bus 22.

As shown in FIG. 3 or FIG. 8, the first electrode layer 34 and first electrode wiring 21 are connected via a first via hole H1 disposed at the first insulating layer 33.

The material of the first electrode layer 34 may be transparent metal oxide materials, such as indium tin oxide, indium zinc oxide, which can improve the light transmittance of top emission light-emitting base plate.

It is for sure that, the material of the first electrode layer 34 may also be metal, which is not limited in the present disclosure.

The material of first electrode wiring 21 may be metal with a high conductivity. Due to the high conductivity of metal, IR drop on the first electrode layer 34 may be reduced by connecting the first electrode wiring 21 with the first electrode layer 34, which may improve the uniformity of the signal on the first electrode layer 34, thereby improving the uniformity of the display.

It is for sure that, the material of the first electrode wiring 21 may also be metal oxide material, which is also not limited in the present disclosure.

In a specific implementation, the electrode signal bus 22 may also be connected to an input end of a transparent electrode signal, for transmitting the transparent electrode signal input by the input end of the transparent electrode signal.

In the light-emitting base plate provided in the present disclosure, since the first electrode wiring 21 is directly connected to the electrode signal bus 22 via the electrode signal leading wire 23, the electrode signal bus 22 can transmit the transparent electrode signal directly to the first electrode wiring 21, which is then transmitted from first electrode wiring 21 to first electrode layer 34. Since the transparent electrode signal on the first electrode wiring 21 is directly input by the electrode signal bus 22, and the impedance of the first electrode wiring 21 is small, and the IR drop of the transparent electrode signal transmitted on the first electrode wiring 21 is small, so that the uniformity of the transparent electrode signal on first electrode wiring 21 may be improved, thereby improving the uniformity of the transparent electrode signal on the first electrode layer 34, and improving the display uniformity and improving the effect of using the auxiliary electrode to reduce the IR drop.

Exemplary, the first electrode layer 34 may be used as a cathode layer, correspondingly, the first electrode wiring 21 may be used as an auxiliary cathode, the present disclosure is not limited herein. The first electrode layer 34 may be a fully connected one-piece structure, and the orthographic projection of the first electrode layer 34 on the substrate 3 at least covers the display area and part of the frame area.

The inventors found that, since first via hole H1 is located at the display area, in the direction of the plane where the substrate 31 is located, the size of the first via hole H1 is small, which may lead to a large contact resistance or even contact failure between the first electrode layer 34 and the first electrode wiring 21, which in turn may affect the transmission of the transparent electrode signal from the electrode signal bus 22 to the first electrode layer 34, and affect the uniformity of the transparent electrode signal at the first electrode layer 34.

Optionally, as shown in FIG. 3 or FIG. 8, the first electrode layer 34 and the electrode signal bus 22 are connected via the sixth via hole H6 at the first insulating layer 33.

Since the first electrode layer 34 is directly connected to the electrode signal bus 22 via the sixth via hole H6, the electrode signal bus 22 may transmit the transparent electrode signals directly to the first electrode layer 34, which adds transmission channels of the transparent electrode signals to the first electrode layer 34, thereby further improving the uniformity of the transparent electrode signal at the first electrode layer 34, and improving the uniformity of the display.

In addition, since the sixth via hole H6 is located at the frame area, in the direction of the plane where the substrate 31 is located, the size of the sixth via hole H6 may be larger than the size of the first via hole H1. Due to the larger size of the sixth via hole H6, the lap area between the first electrode layer 34 and electrode signal bus 22 may be enlarged, and the contact resistance is reduced, ensuring an efficient connection between the first electrode layer 34 and the electrode signal bus 22.

As shown in FIG. 2 or FIG. 7, the functional layer 32 may also include a data signal leading wire 24 located at the frame area, and a data wiring 25 located at the display area. The data signal leading wire 24 is connected to the data wiring 25, and the data signal leading wire 24 is used for providing a data signal to the data wiring 25, and the light-emitting device in the light-emitting base plate emits light driven by the data signal.

Within the plane where the substrate 31 is located, the data signal leading wire 24 may be distributed in axial symmetry. The extending direction of the axis of symmetry may be parallel to the extending direction of the data wiring 25.

In the specific implementation, the electrode signal leading wire 23 and the data signal leading wire 24 located at the frame area may be set in a variety of ways, and the two may be set at the same layer or at different layers, and the present disclosure is not limited herein.

In an alternative embodiment, as shown in FIG. 2, the orthographic projection of the data signal leading wire 24 on the substrate 1 and the orthographic projection of the electrode signal leading wire 23 have overlapped area on the substrate 1 are overlapped, i.e., the orthographic projection of the data signal leading wire 24 on the substrate 31 and the orthographic projection of the electrode signal leading wire 23 on the substrate 31 overlaps. The data signal leading wire 24 and the electrode signal leading wire 23 are located at different layers.

Since the data signal leading wire 24 and the electrode signal leading wire 23 are located at different layers, short circuits caused by overlapping may be avoided, and lateral coupling capacitance between the data signal leading wire and the electrode signal leading wire 23 may be reduced, which reduces signal interference between each other.

In addition, the data signal leading wire 24 and the electrode signal leading wire 23 are placed overlapping each other in different layers, this may reduce the occupied area of the frame area, thus realizing a light-emitting base plate with narrow borders.

As shown in FIG. 2, the data signal leading wire 24 and the electrode signal bus 22 may be located at the same side of the display area. In FIG. 2, the data signal leading wire 24 and the electrode signal bus 22 are both located at the lower side of the display, that is, the lower frame area.

In this case, in order to further reduce the occupation to the frame area, the data signal leading wire 24 and the electrode signal bus 22 may be located at different layers and overlapped. As shown in FIG. 2, the orthographic projection of the data signal leading wire 24 on the substrate 31 and the orthographic projection of the electrode signal bus 22 overlap, the data signal leading wire 24 and the electrode signal bus 22 are located at different layers.

In the implementation, in order to implement the connection between a plurality of first electrode wirings 21 and the electrode signal bus 22, the extending direction of the first electrode wiring 21 may be different from the extending direction of the electrode signal bus 22.

For example, as shown in FIG. 2, the extending direction of the first electrode wiring 21 is perpendicular to the extending direction of the electrode signal bus 22. In FIG. 2, the first electrode wiring 21 extends in a column direction, and the electrode signal bus 22 extends in a row direction.

Since the first electrode wiring 21 extends in the column direction, the IR drop in the column direction may be improved. In addition, since the electrode signal bus 22 extends in the row direction, a plurality of first electrode wirings 21s may be arranged in the row direction, and they are respectively connected to the electrode signal bus 22, thus improving the IR drop in the row direction and increasing the uniformity of the transparent electrode signal in all directions on the first electrode wirings 21, and improving the uniformity of the transparent electrode signal in all directions on the first electrode layer 34, and improving the display uniformity.

Optionally, as shown in FIG. 3, the functional layer 32 may include a first wiring layer 35, a second insulating layer 36, a second wiring layer 37, a third insulating layer 38, and a third wiring layer 39 that are stacked. The first insulating layer 33 is disposed at a side of the third wiring layer 39 away from the substrate 31.

To dispose the data signal leading wire 24 and the electrode signal leading wire 23 to be in different layers, optionally, the data signal leading wire 24 may be located at the second wiring layer 37, and the electrode signal leading wire 23 may be located at the third wiring layer 39.

Since the third wiring layer 39 is at a side of the second wiring layer 37 away from the first wiring layer 35, the electrode signal leading wire 23 is at a side of data signal leading wire 24 away from the first wiring layer 35, the coupling capacitance between the electrode signal leading wire 23 and the first wiring layer 35 may be reduced, which avoids the signal interference occurs between the electrode leading wire 23 and the first wiring layer 35.

Figure 4:
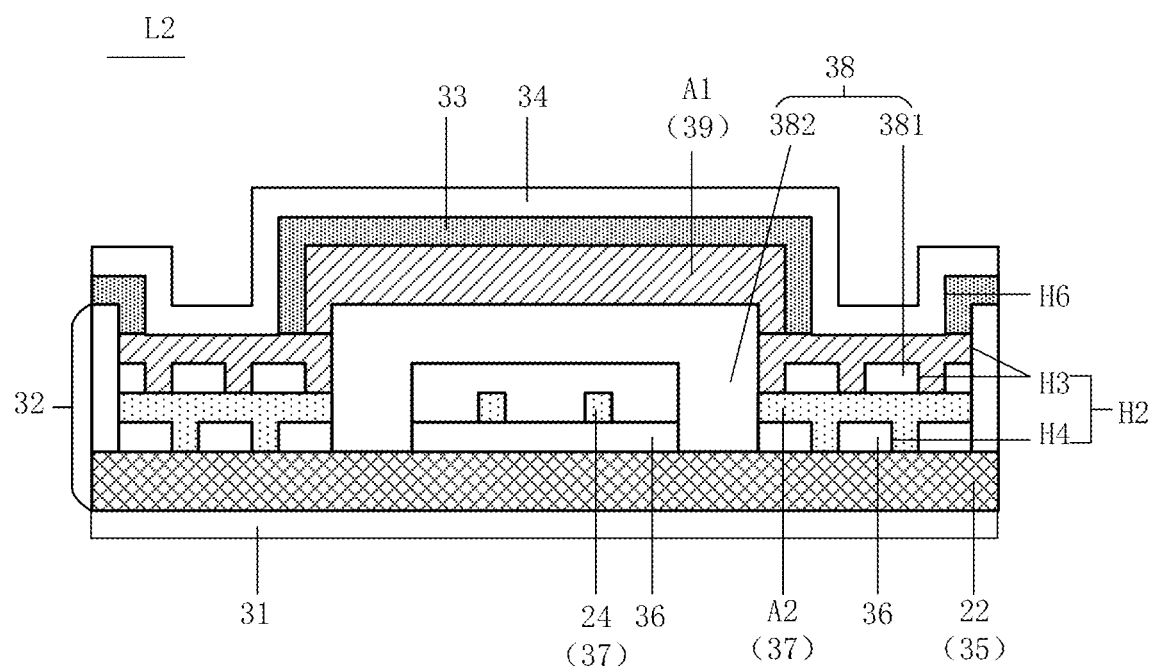
FIG. 4 is a sectional diagram showing the section of the first type of the light-emitting base plate at L2 position according to an embodiment of the present disclosure.
Figure 5:
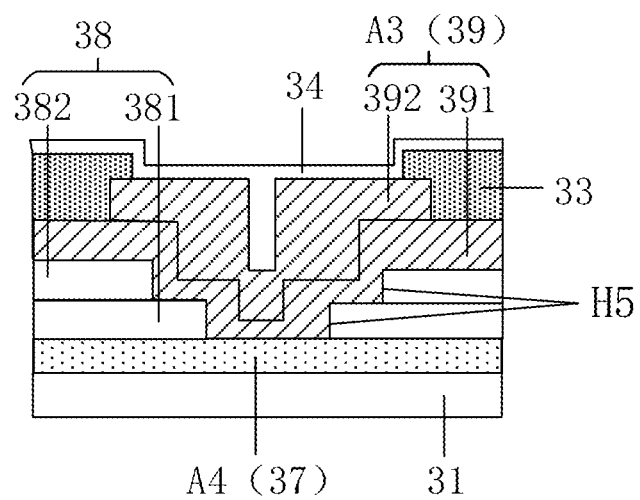
FIG. 5 is a sectional diagram showing the section of the first type of the light-emitting base plate at L3 position according to an embodiment of the present disclosure.

As shown in FIG. 3 to FIG. 5, the third insulating layer 38 may include a passivation layer 381 and a flat layer 382 disposed in stack, the flat layer 382 is disposed at a side of the passivation layer 381 away from the substrate 31.

Since the flat layer 382 made of organic materials may be have a larger thickness, the flat layer 382 of the larger thickness may further increase the longitudinal distance between the data signal leading wire 24 and the electrode signal leading wire 23, and further reduces the coupling capacitance of the data signal leading wire 24 and the electrode signal leading wire 23, and then reduces signal interference between each other.

In a specific implementation, the material of the first wiring layer 35 may include at least one of metal and metal oxide.

The material of the second wiring layer 37 may include at least one of metal and metal oxide.

The material of the third wiring layer 39 may include at least one of metal and metal oxide.

Herein, at least one of metal and metal oxide refers to, including metal, or including metal oxide, or include metal and metal oxide.

Among them, metal includes copper, aluminum, magnesium, molybdenum, gold, silver, etc.; metal oxide includes indium tin oxide, etc.

Since the electrode signal leading wire 23 is located at the third wiring layer 39 and the metal has less impedance, the resistance of the electrode signal leading wire 23 may be reduced.

Optionally, as shown in FIG. 3, the electrode signal bus 22 may be located at the first wiring layer 35.

To implement a connection between the electrode signal leading wire 23 and the electrode signal bus 22, optionally, as shown in FIG. 2 to FIG. 4, the third wiring layer 39 may also include: a first adapting portion A1 connected to one end of the electrode signal leading wire 23 close to the electrode signal bus 22, the first adapting portion A1 and the electrode signal bus 22 are connected via the second via hole H2 disposed at the third insulating layer 38 and the second insulating layer 36.

Since the second via hole H2 is located at the frame area, the size of the second via hole H2 may be larger than the size of the first via hole H1 at the direction of the plane where the substrate is located. Due to the larger size of the second via hole H2, the lapping area between the first adapting portion A1 and the electrode signal bus 22 may be enlarged, and the contact resistance is reduced, which ensures an efficient connection between the electrode signal leading wire 23 and the electrode signal bus 22.

As shown in FIG. 3 or FIG. 4, the second via hole H2 may include a third via hole H3 disposed at the third insulating layer 38, and a fourth via hole H4 disposed at the second insulating layer 36. Correspondingly, the second wiring layer 37 may also include a second adapting portion A2 located at the frame area, the second adapting portion A2 is connected to first adapting portion A1 via the third via hole H3, and the second adapting portion A2 is connected to electrode signal bus 22 via the fourth via hole H4.

By disposing the second adapting portion A2 between the first adapting portion A1 and the electrode signal bus 22, the second adapting portion A2 is connected to the first adapting portion A1 and the electrode signal bus 22 on its two sides through via holes, i.e. the second adapting portion A2 is connected to the first adapting portion A1 through the third via hole H3, and the second adapting portion A2 is connected to the electrode signal bus 22 through the fourth via hole H4, the depth of the third via hole H3 and the depth of the fourth via hole H4 are less than the depth of the second via hole H2, in order to reduce the process complexity of preparing vias, increase the effective contact area between the first adapting portion A1 and the electrode signal bus 22, and reduce the contact resistance.

To connect the electrode signal leading wire 23 and the first electrode wiring 21, optionally, as shown in FIG. 2, FIG. 3 and FIG. 5, the third wiring layer 39 may also include a third adapting portion A3 connected to one end of the electrode signal leading wire 23 close to the first electrode wiring 21.

Accordingly, an end of the first electrode wiring 21 close to the electrode signal bus 22 extends to the frame area and connects to the fourth adapting portion A4, the first electrode wiring 21 and the fourth adapting portion A4 are both located at the second wiring layer 37.

Among them, the third adapting portion A3 and the fourth adapting portion A4 may be connected via the fifth via hole H5 disposed at the third insulating layer 38.

Since the fifth via hole H5 is located at the frame area, the size of the fifth via hole H5 is larger than the size of the first via hole H1 in the direction of the plane where the substrate is located. Due to the larger size of the fifth via hole H5, the lapping area between the third adapting portion A3 and the fourth adapting portion A4 may be increased, which may reduce the contact resistance, ensures an efficient connection between the first electrode wiring 21 and the electrode signal leading wire 23.

As shown in FIG. 2, the third adapting portion A3 and the fourth adapting portion A4 may be close to the boundary line of the display area and the frame area within a packaging area.

In the implementation, since the first electrode wiring 21 is located at the second wiring layer 37, the first via hole H1 may run through the first insulating layer 33 and the third insulating layer 38, thereby implementing the connection between the first electrode layer 34 and the first electrode wiring 21, under such situation, the first via hole H1 is a deep hole.

Alternatively, as shown in FIG. 3, a fifth adapting portion A5 may be disposed at the third wiring layer 39, to allow the first electrode layer 34 to be connected to the fifth adapting portion A5 via the first via hole H1, the fifth adapting portion A5 is connected to the first electrode wiring 21 by a seventh via hole H7 disposed at the third insulating layer 38. In this way, the process complexity of preparing via holes may be reduced, the effective contact area between the first electrode layer 34 and the first electrode wiring 21 may be increased, and the contact resistance may be reduced.

In FIG. 3, in the display area, a luminescent layer material may be disposed between the first insulating layer 33 and the first electrode layer 34. In order to implement the connection between the first electrode layer 34 and first electrode wiring 21, firstly, a groove may first be formed at the side of the fifth adapting portion A5, and then a sputtering process may be used to form the first electrode layer 34, to make the first electrode layer 34 formed in the groove at the side of the fifth adapting portion A5, thereby realizing lapping connection between the first electrode layer 34 and the first electrode wiring 21.

In order to form the groove at the side of the fifth adapting portion A5, optionally, as shown in FIG. 5, the third wiring layer 39 includes a first conducting layer 391 and a second conducting layer 392. The second conducting layer 392 is located at a side of the first conducting layer 391 away from the substrate 31. The material of the first conducting layer 391 may include metal oxides such as indium tin oxide, and the material of the second conducting layer 392 may include metal oxides such as indium tin oxide, and metals.

As shown in FIG. 3 and FIG. 4, in order to realize that connection between the first electrode layer 34 and the electrode signal bus 22 via the sixth via hole H6 on the first insulating layer 33, optionally, first electrode layer 34 is connected to the first adapting portion A1 via the sixth via hole H6 disposed at the first insulating layer 33. The first adapting portion A1 and the second adapting portion A2 are connected with each other via a third via hole H3 disposed at the third insulating layer 36, and the second adapting portion A2 and the electrode signal bus 22 are connected with each other via a fourth via hole H4 disposed at the second insulating layer 36.

In a specific implementation, the functional layer 32 may include a plurality of TFTs (thin-film transistors) located at the display area. The thin-film transistors are used to drive the light-emitting device in light-emitting base plate to emit light under the control of an external signal.

Optionally, the functional layer 32 includes a first TFT (not shown) located at the display area, a data wiring 25. The source and the drain of the first TFT are located at the second wiring layer 37, the data wiring 25 is connected to the source or the drain of the first TFT.

As shown in FIG. 2, the data signal leading wire 24, the data wiring 25, the first electrode wiring 21, and the source and drain of the first TFT are located at the same layer, i.e., at the second wiring layer 37.

Since the data wiring 25 is located at the same layer as the first electrode wiring 21, in order to prevent short cut between the data wiring 25 and the first electrode wiring 21, the extending direction of the data wiring 25 may be the same as the extending direction of the first electrode wiring 21, that is, the extending direction of the data wiring 25 is parallel to the extending direction of the first electrode wiring 21.

It is for sure that, the extending direction of the data wiring 25 may be different from the extending direction of the first electrode wiring 21, as long as make sure that the data wiring 25 and the first electrode wiring 21 do not intersect.

Optionally, the functional layer 32 includes a second TFT (not shown) located at the display area. The first wiring layer 35 may also include a gate wiring 26 located at the display area and a gate of the second TFT, the gate wiring 26 is connected to the gate of the second TFT.

As shown in FIG. 2, the electrode signal bus 22, the gate wiring 26, and the gate of the second TFT are all located at the same layer, i.e., the first wiring layer 35.

Optionally, as shown in FIG. 2, the functional layer 32 includes a third TFT (not shown) located at the display area. The third wiring layer 39 may also include a plurality of second electrodes 27 located within the display area. The second electrode 27 is connected to the third TFT.

In a specific implementation, the source and drain of the third TFT may be located at the second wiring layer 37, the second electrode 27 located at the third wiring layer 39, the second electrode 27 may be connected to the source or drain of the third TFT through via holes disposed at the third insulating layer 38.

For example, the first electrode layer 34 is the cathode layer, and the second electrode 27 may be the anode, and the present disclosure is not limited herein. It is also possible that the first electrode layer 34 is the anode layer and the second electrode 27 may be the cathode.

As shown in FIG. 2, the second electrode 27 and electrode signal leading wire 23 are located at the same layer, i.e., the third wiring layer 39.

Wherein, the first TFT, the second TFT and the third TFT may be different from each other, or two of them are the same TFTs, or three are the same TFTs, the present disclosure is not limited herein.

When the third wiring layer 39 includes a first conducting layer 391 and a second conducting layer 392, the second conducting layer 392 is located at a side of the first conducting layer 391 away from the substrate 31, and when the second conducting layer 392 includes metal oxide and metal, metal may be located at a surface of a side of the second conducting layer 392 away from the substrate 31, which can improve the reflectivity of light incident on the metal surface, increase the reflectivity of the second electrode, and improves the light output efficiency of the top-emitting light-emitting device.

Figure 6:
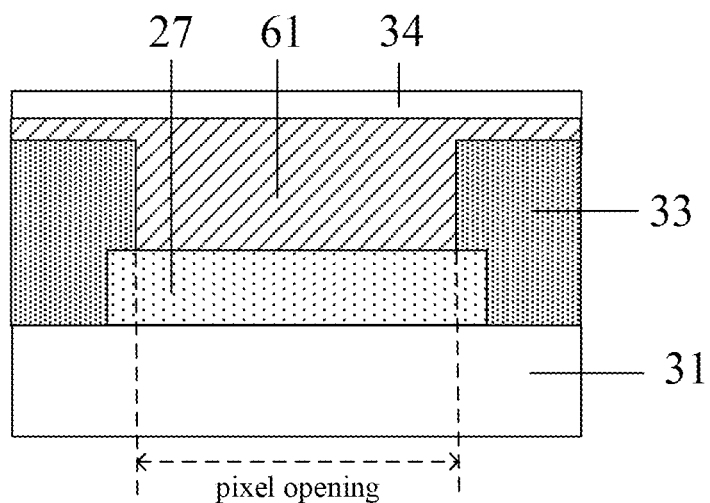
FIG. 6 is a sectional diagram showing the section of the first type of the light-emitting base plate at L4 position according to an embodiment of the present disclosure.

As shown in FIG. 6, the first insulating layer 33 may be reused as a pixel defining layer, the pixel defining layer has multiple pixel openings, the orthographic projection of the pixel opening on the substrate 31 is located within the orthographic projection of the second electrode 27 on the substrate 31.

Optionally, the light-emitting base plate may also include: a luminescent layer 61 at least located in the pixel opening

34, the first electrode layer 34 is disposed at a side of the luminescent layer 61 away from the substrate 31.

As shown in FIG. 6, a second electrode 27 located in the pixel opening, the luminescent layer 61, and the first electrode layer 34 form a light-emitting device. The luminescent layer 61 may include one or more color luminescent layers such as white luminescent layer, red luminescent layer, green luminescent layer, and blue luminescent layer.

It should be noted that within the first wiring layer 35, the electrode signal bus 22 is insulated from the gate wirings. In the second wiring layer 37, the second adapting portion A2 in the frame area, the data signal leading wire 24 and the fourth adapting portion A4 are insulated from each other, and the first electrode wiring 21 and the data wiring 25 in the display area are insulated from each other. Within the third wiring layer 39, the second electrode 27 and the electrode signal leading wire 23 are insulate from each other.

In another alternative implementation, as shown in FIG. 7 and FIG. 8, the orthographic projection of the data signal leading wire 24 on the substrate 31 and the orthographic projection of the electrode signal leading wire 23 on the substrate 31 have no overlap, and the data signal leading wire 24 and the electrode signal leading wire 23 are disposed at the same layer.

Optionally, the data signal leading wire 24 and the electrode signal bus 22 may be located at different sides of the display area.

For example, as shown in FIG. 7, the data signal leading wire 24 is located at the lower side of the display area, and the electrode signal bus 22 is located at the upper, the left and the right sides of the display area, i.e., the data signal leading wire 24 is located at the lower frame area, the electrode signal bus 22 is located at the upper frame area, left frame area, and right frame area.

In the embodiment, since the electrode signal bus 22 is located on the upper, left and right sides of the display area, the electrode signal bus 22 forms a semi-enclosed structure, which can shield the interference of external signals, and improve the stability of the display.

For example, the data signal leading wire 24 and the electrode signal bus 22 may also be located at opposite sides of the display area, for example, the data signal leading wire 24 is located at the lower side of the display area, and the electrode signal bus 22 is located at the upper side of the display area.

As shown in FIG. 7, the orthographic projection of the data signal leading wire 24 on substrate 31 and the orthographic projection of the electrode signal bus 22 on substrate 31 have no overlap, the data signal leading wire 24 and the electrode signal bus 22 may be located at the same or different layers, which is not limited in the present disclosure.

The present disclosure further discloses a light-emitting device, including the light-emitting base plate above.

Since the light-emitting device includes the light-emitting base plate described above, those skilled person in the art may understand that the light-emitting device has the advantages of the light-emitting base plate of the present disclosure, they will not be repeated here.

It should be noted that the light-emitting device in the embodiment may be: a display panel, an electronic paper, a mobile phone, a tablet computer, a TV, a laptop, a digital photo frame, a virtual reality device, an augmented reality device, an under-screen camera device and navigator and the like, and may be any products or parts having 2D or 3D display function.

In the implementation, as shown in FIG. 2 or FIG. 7, the data signal leading wire 24 and leading wires connecting to the electrode signal bus 22 in the light-emitting base plate may extend to a bonding area, and the input of the transparent electrode signal is located at the bonding region. The bonding area is used to bond the flexible circuit board, through which the driving chip may be connected. The driving chip may provide data signals and transparent electrode signals.

The inventors found that, when the light-emitting base plate is larger, the IR drop on the first electrode layer 34 is more obvious. When the light-emitting base plate provided in the present disclosure is applied to large-sized light-emitting devices such as televisions or monitors, the phenomenon of uneven display may be improved more significantly.

The present disclosure discloses a method for preparing a light-emitting base plate, the light-emitting base plate includes a display area and a frame area located at a side of the display area, the method includes:

Step S01: providing a substrate.

Step S02: forming a functional layer at one side of the substrate, wherein the functional layer comprises: a first electrode wiring located at the display area, an electrode signal bus located at the frame area, and an electrode signal leading wire for connecting the first electrode wiring and the electrode signal bus;

Step S03: forming the first insulating layer and the first electrode layer at one side of the functional layer away from the substrate in turn, wherein the first insulating layer is located between the functional layer and the first electrode layer, and the first electrode layer is connected to the first electrode wiring via the first via hole disposed on the first insulating layer.

Using the method for preparing the light-emitting base plate provided in the present disclosure, any of the above light-emitting base plates may be prepared.

Each embodiment in the present specification is described in a progressive manner, each embodiment highlights the difference from other embodiments, and the same similar parts between each embodiment may be referred to each other.

Finally, it should be noted that herein, relational terms such as first and second, etc., are only used to distinguish an entity or operation from another, and do not necessarily require or imply any such actual relationship or order between these entities or operations. Further, the term "comprising", "including" or any other variation thereof is intended to cover non-exclusive inclusions so that a process, method, good or equipment comprising a series of elements includes not only those elements, but also other elements not expressly listed or elements inherent in such process, method, good or equipment. Without further restrictions, the elements qualified by the statement "comprising a . . . " do not exclude the existence of other identical elements in the process, method, goods or equipment comprising the elements.

In the above illustration, the light-emitting base plate provided in the present disclosure and a method for manufacturing the same, a light-emitting device are illustrated. The principle and embodiment of the present disclosure are elaborated in detail, and the description of the above embodiments is only used to help understand the methods of the present disclosure and its core ideas. For those skilled persons in the art, according to the idea of the present disclosure, there will be changes in the specific embodiments and the scope of application. In summary, the content of the specification should not be understood as a restriction to the present disclosure.

Those skilled in the art will easily think of other embodiments of the present disclosure after considering the description and practice of the invention disclosed herein. The present disclosure is intended to cover any variant, use, or adaptable variation. The variant, use, or adaptable variation of the present disclosure follows the general principles and includes common knowledge or common sense or customary technical means in the art. The description and embodiments are considered exemplary only, and the scope and spirit of this disclosure are indicated by the claims.

It should be understood that the present disclosure is not limited to the precise structure described above and in the accompanying drawings, and may be modified and altered without departing from its scope. The scope of this disclosure is limited only by the accompanying claims.

The term "one embodiment", "embodiment" or "one or more embodiments" herein means that the specific features, structures or characteristics described in relating with embodiments are included in at least one embodiment of the present disclosure. Further, it should be noted that the phrase "in one embodiment" herein does not necessarily refer to the same embodiment.

A number of specific details are explained in the specification provided herein. However, it is understood that embodiments of the present disclosure may be practiced without these specific details. In some instances, well-known methods, structures and techniques are not shown in detail so as not to obscure the understanding of this specification.

In the claims, any reference numeric located between the parentheses should not be considered as a limitation on the claims. The word "contains" does not exclude the existence of components or steps that are not listed in the claims. The word "a" or "one" before the elements does not exclude the existence of more than one such element. The present disclosure may be implemented by means of hardware including a number of different elements and by means of a properly programmed computer. In the claims of the enumerated devices, several of these devices may be embodied by the same hardware item. The use of the words first, second, and third does not indicate any order. These words may be interpreted as names.

Finally, it should be noted that the above embodiments are only used to illustrate the technical solution of the present disclosure, and are not limited thereto. Although the present disclosure is described in detail with reference to the foregoing embodiments, those of ordinary skill in the art should understand: they may still modify the technical solutions described in each of the foregoing embodiments, or equivalently replace some of the technical features; and these modifications or replacements do not depart the essence of the corresponding technical solutions from the spirit and scope of the technical solutions of each embodiment of the present disclosure.

The invention claimed is:

1. A light-emitting base plate, comprising a display area and a frame area located at one side of the display area, wherein the light-emitting base plate comprises: a substrate, a functional layer disposed at one side of the substrate, a first insulating layer and a first electrode layer stacked at one side of the functional layer away from the substrate, and the first insulating layer is located between the functional layer and the first electrode layer;

the functional layer comprises: a first electrode wiring located at the display area, an electrode signal bus located at the frame area, and an electrode signal leading wire connecting the first electrode wiring and the electrode signal bus; and the first electrode layer is connected to the first electrode wiring through a first via hole provided at the first insulating layer, the functional layer further comprises: a data signal leading wire located at the frame area and a data wiring located at the display area, and the data signal leading wire is connected to the data wiring; and an orthographic projection of the data signal leading wire and an orthographic projection of the electrode signal leading wire on the substrate overlap, and the data signal leading wire and the electrode signal leading wire are located at different layers.

2. The light-emitting base plate according to claim 1, wherein the functional layer further comprises a first wiring layer, a second insulating layer, a second wiring layer, a third insulating layer and a third wiring layer disposed in stack, and the first insulating layer is provided at a side of the third wiring layer away from the substrate; and the data signal leading wire is located at the second wiring layer, and the electrode signal leading wire is located at the third wiring layer.

3. The light-emitting base plate according to claim 2, wherein the electrode signal bus is located at the first wiring layer, the third wiring layer further comprises: a first adapting portion connected to one end of the electrode signal leading wire close to the electrode signal bus, and the first adapting portion and the electrode signal bus are connected through a second via hole disposed at the second insulating layer and the third insulating layer.

4. The light-emitting base plate according to claim 3, wherein the second via hole comprises a third via hole disposed at the third insulating layer, and a fourth via hole disposed at the second insulating layer; and the second wiring layer further comprises a second adapting portion located at the frame area, the second adapting portion is connected to the first adapting portion via the third via hole, and the second adapting portion is connected to the electrode signal bus via the fourth via hole.

5. The light-emitting base plate according to claim 2, wherein the third wiring layer further comprises a third adapting portion connected to one end of electrode signal leading wire close to the first electrode wiring;

one end of the first electrode wiring close to the electrode signal bus extends to the frame area, and is connected to the fourth adapting portion, and the first electrode wiring and the fourth adapting portion are both located at the second wiring layer; and the third adapting portion and the fourth adapting portion are connected via a fifth via hole disposed at the third insulating layer.

6. The light-emitting base plate according to claim 2, wherein the functional layer comprises a first TFT located at the display area, the data wiring, and a source and a drain of the first TFT are all located at the second wiring layer, and the data wiring is connected to the source or the drain of the first TFT; and an extending direction of the data wiring is the same as an extending direction of the first electrode wiring.

7. The light-emitting base plate according to claim 2, wherein the functional layer comprises a second TFT located at the display area, the first wiring layer further comprises a gate wiring located at the display area, and a gate of the second TFT, and the gate wiring is connected to the gate of the second TFT.

8. The light-emitting base plate according to claim 2, wherein the functional layer comprises a third TFT located at the display area, the third wiring layer further comprises a plurality of second electrodes located at the display area, and the second electrode is connected to the third TFT.

9. The light-emitting base plate according to claim 8, wherein the first insulating layer is reused as a pixel defining layer, the pixel defining layer has a plurality of pixel openings, and orthographic projections of the pixel openings on the substrate are located within the scope of an orthographic projection of the second electrode on the substrate; and the light-emitting base plate further comprises a luminescent layer disposed in the pixel openings, and the first electrode layer is disposed at one side of the luminescent layer away from the substrate.

10. The light-emitting base plate according to claim 1, wherein the data signal leading wire and the electrode signal bus are located at the same side of the display area.

11. The light-emitting base plate according to claim 1, wherein an extending direction of the first electrode wiring is different from an extending direction of the electrode signal bus; or, an extending direction of the first electrode wiring is perpendicular to an extending direction of the electrode signal bus.

12. The light-emitting base plate according to claim 1, wherein the first electrode layer is connected to the electrode signal bus via a sixth via hole disposed at the first insulating layer.

13. A light-emitting device, comprising a light-emitting base plate according to claim 1.

14. The light-emitting device according to claim 13, wherein the functional layer comprises a first wiring layer, a second insulating layer, a second wiring layer, a third insulating layer and a third wiring layer disposed in stack, and the first insulating layer is provided at a side of the third wiring layer away from the substrate; and the data signal leading wire is located at the second wiring layer, and the electrode signal leading wire is located at the third wiring layer.

15. The light-emitting device according to claim 14, wherein the electrode signal bus is located at the first wiring layer, the third wiring layer further comprises: a first adapting portion connected to one end of the electrode signal leading wire close to the electrode signal bus, and the first adapting portion and the electrode signal bus are connected through a second via hole disposed at the second insulating layer and the third insulating layer.

16. A light-emitting base plate, comprising a display area and a frame area located at one side of the display area, wherein the light-emitting base plate comprises: a substrate, a functional layer disposed at one side of the substrate, a first insulating layer and a first electrode layer stacked at one side of the functional layer away from the substrate, and the first insulating layer is located between the functional layer and the first electrode layer;

the functional layer comprises: a first electrode wiring located at the display area, an electrode signal bus located at the frame area, and an electrode signal leading wire connecting the first electrode wiring and the electrode signal bus; and the first electrode layer is connected to the first electrode wiring through a first via hole provided at the first insulating layer;

the functional layer further comprises: a data signal leading wire located at the frame area, and a data wiring located at the display area, and the data signal leading wire is connected to the data wiring; and an orthographic projection of the data signal leading wire on the substrate and an orthographic projection of the electrode signal leading wire on the substrate do not overlap, and the data signal leading wire and the electrode signal leading wire are disposed at the same layer.

17. The light-emitting base plate according to claim 16, wherein the data signal leading wire and the electrode signal bus are located at different sides of the display area.

18. The light-emitting base plate according to claim 16, wherein the first electrode layer is connected to the electrode signal bus via a sixth via hole disposed at the first insulating layer.

19. A light-emitting device, comprising a light-emitting base plate according to claim 16.

20. A method for manufacturing a light-emitting base plate, the light-emitting base plate comprising a display area and a frame area located at one side of the display area, the method comprising:

providing a substrate;

forming a functional layer at one side of the substrate, wherein the functional layer comprises: a first electrode wiring located at the display area, an electrode signal bus located at the frame area, and an electrode signal leading wire for connecting the first electrode wiring and the electrode signal bus; and forming a first insulating layer and a first electrode layer in turn at one side of the functional layer away from the substrate, wherein the first insulating layer is located between the functional layer and the first electrode layer, and the first electrode layer is connected to the first electrode wiring through a first via hole disposed at the first insulating layer;

wherein the functional layer further comprises: a data signal leading wire located at the frame area and a data wiring located at the display area, and the data signal leading wire is connected to the data wiring; and an orthographic projection of the data signal leading wire and an orthographic projection of the electrode signal leading wire on the substrate overlap, and the data signal leading wire and the electrode signal leading wire are located at different layers.

* * * * *